US012683633B2

(12) United States Patent
El-Hassan et al.

(10) Patent No.: US 12,683,633 B2
(45) Date of Patent: Jul. 14, 2026

(54) SYSTEMS AND METHODS FOR TRANSMITTING RADIO FREQUENCY SIGNALS IN MULTIPLE FREQUENCY BANDS

(71) Applicant: Apple Inc., Cupertino, CA (US)

(72) Inventors: Wassim El-Hassan, San Jose, CA (US); Brian H Bremer, Arlington Heights, IL (US); Lydi Smaini, San Jose, CA (US); Abhinav Dayal, San Jose, CA (US); Daphne I Gorman, San Jose, CA (US); Xuefeng Zhao, San Jose, CA (US); Kai Bai, San Jose, CA (US)

(73) Assignee: Apple Inc., Cupertino, CA (US)

( * ) Notice: Subject to any disclaimer, the term of this patent is extended or adjusted under 35 U.S.C. 154(b) by 350 days.

(21) Appl. No.: 18/430,059

(22) Filed: Feb. 1, 2024

(65) Prior Publication Data

US 2024/0297669 A1     Sep. 5, 2024

Related U.S. Application Data

(60) Provisional application No. 63/449,698, filed on Mar. 3, 2023.

(51) Int. Cl.
*H04B 1/00* (2006.01)
*H03F 3/19* (2006.01)

(52) U.S. Cl.
CPC ............ *H04B 1/0064* (2013.01); *H03F 3/19* (2013.01); *H04B 1/0075* (2013.01); *H03F 2200/451* (2013.01)

(58) Field of Classification Search
CPC . H04B 1/40; H04B 1/04; H04B 1/406; H04B 1/0475; H04B 1/006; H04B 1/28; H04B 2001/0425; H04B 1/005; H04B 2001/0408; H04B 1/30; H04B 1/16; H04B 1/0007; H04B 1/0483; H04B 1/1036; H04B 1/3822; H04B 1/0057; H04B 1/18
USPC .......................................... 455/77
See application file for complete search history.

(56) References Cited

U.S. PATENT DOCUMENTS

2014/0266479 A1* 9/2014 Rong .................... H03B 5/1228
                                                331/117 FE
2019/0068235 A1* 2/2019 Branlund ................. H04B 1/40
2020/0150144 A1* 5/2020 Marx .................... H03M 3/396

* cited by examiner

*Primary Examiner* — Ajibola A Akinyemi
(74) *Attorney, Agent, or Firm* — FLETCHER YODER PC

(57) ABSTRACT

Wireless communication circuitry includes a single transmission pathway for transmitting radio frequency signals in different frequency bands used for communicating on different types of wireless networks.

20 Claims, 6 Drawing Sheets

300

RECEIVE INDICATION OF A TYPE OF WIRELESS
COMMUNICATION TO BE USED FOR TRANSMISSION — 302

GENERATE BASEBAND SIGNAL — 304

GENERATE INTERMEDIATE FREQUENCY (IF) SIGNAL — 306

SELECT SIGNAL TO MIX WITH IF SIGNAL BASED
ON INDICATION — 308

GENERATE RADIO FREQUENCY (RF) SIGNAL BY
MIXING SELECTED SIGNAL AND IF SIGNAL — 310

OUTPUT RF SIGNAL — 312

SYSTEMS AND METHODS FOR TRANSMITTING RADIO FREQUENCY SIGNALS IN MULTIPLE FREQUENCY BANDS

CROSS-REFERENCE TO RELATED APPLICATIONS

This application claims priority to U.S. Application No. 63/449,698, entitled "SYSTEMS AND METHODS FOR TRANSMITTING RADIO FREQUENCY SIGNALS IN MULTIPLE FREQUENCY BANDS," filed Mar. 3, 2023, which is hereby incorporated by reference in its entirety for all purposes.

BACKGROUND

The present disclosure relates generally to wireless communication, and more specifically to transmission of wireless signals over multiple frequency ranges.

In an electronic device, a transmitter and a receiver may each be coupled to one or more antennas to enable the electronic device to both transmit and receive wireless signals over one or more frequency ranges. For example, the electronic device may transmit or receive wireless signals over various frequency ranges depending on a type of wireless communication being utilized, such as, WI-FI® communication, BLUETOOTH® communication, or communication utilizing a cellular network (e.g., a $3^{rd}$ generation (3G) cellular network, universal mobile telecommunication system (UMTS), $4^{th}$ generation (4G) cellular network, Long Term Evolution® (LTE) cellular network, Long Term Evolution License Assisted Access (LTE-LAA) cellular network, a $5^{th}$ generation (5G) cellular network, a $6^{th}$ generation (6G) cellular network, a beyond-6G cellular network, and so on). As other forms of wireless communication become available or utilized, it may be desirable to enable electronic devices to communicate utilizing such forms of wireless communication while also being able to communicate using other forms of wireless communication (e.g., WI-FI® communication, BLUETOOTH® communication, or communication utilizing a cellular network).

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In one embodiment, wireless communication circuitry includes a first mixer configured to generate an intermediate frequency (IF) digital signal, a digital-to-analog converter communicatively coupled to the first mixer and configured to convert the IF digital signal to an analog signal. The wireless communication circuitry also includes a first phase-locked loop (PLL) and an oscillator. The wireless communication circuitry further includes a switch communicatively coupled to the first PLL and the oscillator. The switch is configured to receive a first signal from the first PLL and a second signal from the oscillator, and output a third signal by selectively outputting either the first signal or the second signal. Additionally, the wireless communication circuitry includes a second mixer communicatively coupled to the first mixer and the switch.

In another embodiment, an electronic device includes wireless communication circuitry that has a first mixer configured to generate an intermediate frequency (IF) digital signal based at least in part on a baseband signal. The wireless communication circuitry also includes a digital-to-analog converter (DAC) communicatively coupled to the first mixer. Additionally, the wireless communication circuitry includes a first oscillator configured to generate a first signal and a second oscillator configured to generate a second signal. The wireless communication circuitry also includes a second mixer communicatively coupled to the DAC and configured to output a radio frequency (RF) signal to be transmitted in a wireless network. Furthermore, the wireless communication circuitry includes a switch that is configured to couple the second mixer to the first oscillator in a first state, and couple the second mixer to the second oscillator in a second state. The electronic device also includes processing circuitry configured to cause the switch to select the first state or the second state.

In yet another embodiment, a method includes generating, via wireless communication circuitry, a baseband signal and generating, via the wireless communication circuitry, an intermediate frequency (IF) digital signal based at least in part on the baseband signal. Also, the method includes selecting, via a switch of the wireless communication circuitry, a first state of the switch or a second state of the switch. When in the first state, the switch is communicatively coupled to a phase-locked loop (PLL) and configured to receive a first signal having a first frequency from the PLL. When in the second state, the switch is communicatively coupled to an oscillator and configured to receive, from the oscillator, a second signal having a second frequency different from the first frequency. Additionally, the method includes outputting, via the switch, the first signal as a third signal or the second signal as the third signal. Furthermore, the method includes outputting, via the wireless communication circuitry, a radio frequency (RF) signal based on the IF digital signal and the third signal.

Various refinements of the features noted above may exist in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination. The brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings described below in which like numerals refer to like parts.

DETAILED DESCRIPTION OF SPECIFIC EMBODIMENTS

Figure 1:
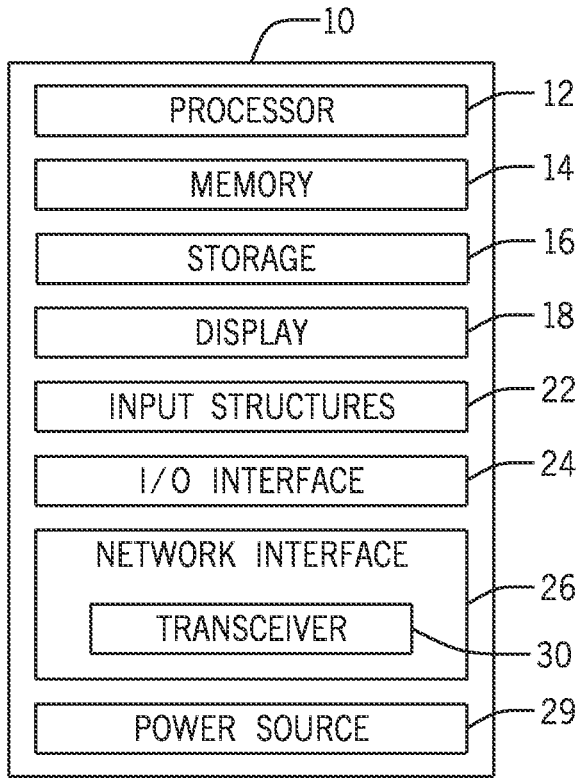
FIG. 1 is a block diagram of an electronic device, according to embodiments of the present disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Furthermore, the particular features, structures, or characteristics may be combined in any suitable manner in one or more embodiments. Use of the terms "approximately," "near," "about," "close to," and/or "substantially" should be understood to mean including close to a target (e.g., design, value, amount), such as within a margin of any suitable or contemplatable error (e.g., within 0.1% of a target, within 1% of a target, within 5% of a target, within 10% of a target, within 25% of a target, and so on). Moreover, it should be understood that any exact values, numbers, measurements, and so on, provided herein, are contemplated to include approximations (e.g., within a margin of suitable or contemplatable error) of the exact values, numbers, measurements, and so on. Additionally, the term "set" may include one or more. That is, a set may include a unitary set of one member, but the set may also include a set of multiple members.

This disclosure is directed to enabling wireless communication using different types of wireless communication that may utilize several frequency ranges (e.g., of wireless signals that are transmitted and/or received). For example, the electronic device may transmit or receive wireless signals over various frequency ranges depending on a type of wireless communication being utilized, such as, WI-FI® communication, BLUETOOTH® communication, or communication utilizing a cellular network (e.g., a 3$^{rd}$ generation (3G) cellular network, universal mobile telecommunication system (UMTS), 4$^{th}$ generation (4G) cellular network, Long Term Evolution® (LTE) cellular network, Long Term Evolution License Assisted Access (LTE-LAA) cellular network, a 5$^{th}$ generation (5G) cellular network, a 6$^{th}$ generation (6G) cellular network, a beyond-6G cellular network, and so on). As other forms of wireless communication become available or utilized, such as communication using a satellite network or a non-terrestrial network, it may be desirable to enable electronic devices to communicate utilizing such forms of wireless communication while also being able to communicate using other forms of wireless communication (e.g., WI-FI® communication, BLUETOOTH® communication, or communication utilizing a cellular network).

Embodiments herein provide various apparatuses and techniques to enable wireless communication using several different wireless communication techniques, including but not limited to WI-FI® communication, BLUETOOTH® communication, and communication utilizing a non-terrestrial network or satellite network. In particular, a common transmission pathway may be utilized to generate radio frequency (RF) signals in multiple frequency bands. Indeed, as described below, a baseband signal may be modified to generate an intermediate frequency (IF) signal based on a type of wireless communication to be utilized. The IF signal may be selectively mixed with another signal that is selected from multiple signals based on the type of wireless communication to generate an RF signal.

FIG. 1 is a block diagram of an electronic device 10, according to embodiments of the present disclosure. The electronic device 10 may include, among other things, one or more processors 12 (collectively referred to herein as a single processor for convenience, which may be implemented in any suitable form of processing circuitry), memory 14, nonvolatile storage 16, a display 18, input structures 22, an input/output (I/O) interface 24, a network interface 26, and a power source 29. The various functional blocks shown in FIG. 1 may include hardware elements (including circuitry), software elements (including machine-executable instructions) or a combination of both hardware and software elements (which may be referred to as logic). The processor 12, memory 14, the nonvolatile storage 16, the display 18, the input structures 22, the input/output (I/O) interface 24, the network interface 26, and/or the power source 29 may each be communicatively coupled directly or indirectly (e.g., through or via another component, a communication bus, a network) to one another to transmit and/or receive signals between one another. It should be noted that FIG. 1 is merely one example of a particular implementation and is intended to illustrate the types of components that may be present in the electronic device 10.

By way of example, the electronic device 10 may include any suitable computing device, including a desktop or notebook computer, a portable electronic or handheld electronic device such as a wireless electronic device or smartphone, a tablet, a wearable electronic device, and other similar devices. In additional or alternative embodiments, the electronic device 10 may include an access point, such as a base station, a router (e.g., a wireless or Wi-Fi router), a hub, a switch, and so on. It should be noted that the processor 12 and other related items in FIG. 1 may be embodied wholly or in part as software, hardware, or both. Furthermore, the processor 12 and other related items in FIG. 1 may be a single contained processing module or may be incorporated wholly or partially within any of the other elements within the electronic device 10. The processor 12 may be implemented with any combination of general-purpose microprocessors, microcontrollers, digital signal processors (DSPs), field programmable gate array (FPGAs), programmable logic devices (PLDs), controllers, state machines, gated logic, discrete hardware components, dedicated hardware finite state machines, or any other suitable entities that may perform calculations or other manipulations of information. The processors 12 may include one or more application processors, one or more baseband processors, or both, and perform the various functions described herein.

In the electronic device 10 of FIG. 1, the processor 12 may be operably coupled with a memory 14 and a nonvolatile storage 16 to perform various algorithms. Such programs or instructions executed by the processor 12 may be stored in any suitable article of manufacture that includes one or more tangible, computer-readable media. The tangible, computer-readable media may include the memory 14 and/or the nonvolatile storage 16, individually or collectively, to store the instructions or routines. The memory 14 and the nonvolatile storage 16 may include any suitable articles of manufacture for storing data and executable instructions, such as random-access memory, read-only memory, rewritable flash memory, hard drives, and optical discs. In addition, programs (e.g., an operating system) encoded on such a computer program product may also include instructions that may be executed by the processor 12 to enable the electronic device 10 to provide various functionalities.

In certain embodiments, the display 18 may facilitate users to view images generated on the electronic device 10. In some embodiments, the display 18 may include a touch screen, which may facilitate user interaction with a user interface of the electronic device 10. Furthermore, it should be appreciated that, in some embodiments, the display 18 may include one or more liquid crystal displays (LCDs), light-emitting diode (LED) displays, organic light-emitting diode (OLED) displays, active-matrix organic light-emitting diode (AMOLED) displays, or some combination of these and/or other display technologies.

The input structures 22 of the electronic device 10 may enable a user to interact with the electronic device 10 (e.g., pressing a button to increase or decrease a volume level). The I/O interface 24 may enable electronic device 10 to interface with various other electronic devices, as may the network interface 26. In some embodiments, the I/O interface 24 may include an I/O port for a hardwired connection for charging and/or content manipulation using a standard connector and protocol, such as the Lightning connector, a universal serial bus (USB), or other similar connector and protocol. The network interface 26 may include, for example, one or more interfaces for a personal area network (PAN), such as an ultra-wideband (UWB) or a BLUETOOTH® network, a local area network (LAN) or wireless local area network (WLAN), such as a network employing one of the IEEE 802.11x family of protocols (e.g., WI-FI®), and/or a wide area network (WAN), such as any standards related to the Third Generation Partnership Project (3GPP), including, for example, a 3$^{rd}$ generation (3G) cellular network, universal mobile telecommunication system (UMTS), 4$^{th}$ generation (4G) cellular network, Long Term Evolution® (LTE) cellular network, Long Term Evolution License Assisted Access (LTE-LAA) cellular network, 5$^{th}$ generation (5G) cellular network, and/or New Radio (NR) cellular network, a 6$^{th}$ generation (6G) or greater than 6G cellular network, a satellite network, a non-terrestrial network, and so on. In particular, the network interface 26 may include, for example, one or more interfaces for using a cellular communication standard of the 5G specifications that include the millimeter wave (mmWave) frequency range (e.g., 24.25-300 gigahertz (GHz)) that defines and/or enables frequency ranges used for wireless communication. The network interface 26 of the electronic device 10 may allow communication over the aforementioned networks (e.g., 5G, Wi-Fi, LTE-LAA, and so forth).

The network interface 26 may also include one or more interfaces for, for example, broadband fixed wireless access networks (e.g., WIMAX®), mobile broadband Wireless networks (mobile WIMAX®), asynchronous digital subscriber lines (e.g., ADSL, VDSL), digital video broadcasting-terrestrial (DVB-T®) network and its extension DVB Handheld (DVB-H®) network, ultra-wideband (UWB) network, alternating current (AC) power lines, and so forth.

As illustrated, the network interface 26 may include a transceiver 30. In some embodiments, all or portions of the transceiver 30 may be disposed within the processor 12. The transceiver 30 may support transmission and receipt of various wireless signals via one or more antennas, and thus may include a transmitter and a receiver. The power source 29 of the electronic device 10 may include any suitable source of power, such as a rechargeable lithium polymer (Li-poly) battery and/or an alternating current (AC) power converter. The electronic device 10, through the network interface 26 or the transceiver 30, may enable wireless communication using several different wireless communication techniques, including but not limited to WI-FI® communication, BLUETOOTH® communication, and communication utilizing a non-terrestrial network or satellite network. In particular, the electronic device 10 may include a common transmission pathway that generates radio frequency (RF) signals in multiple frequency bands. Indeed, as described below, components of the electronic device 10 may modify a baseband signal to generate an intermediate frequency (IF) signal based on a type of wireless communication to be utilized. The IF signal may be selectively mixed with another signal that is selected from multiple signals based on the type of wireless communication to generate an RF signal, in accordance with the embodiments described herein.

Figure 2:
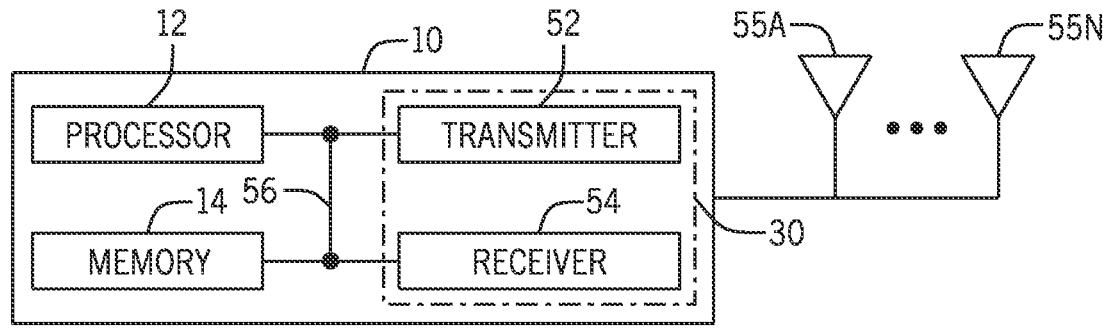
FIG. 2 is a functional diagram of the electronic device of FIG. 1, according to embodiments of the present disclosure.

FIG. 2 is a functional diagram of the electronic device 10 of FIG. 1, according to embodiments of the present disclosure. As illustrated, the processor 12, the memory 14, the transceiver 30, a transmitter 52, a receiver 54, and/or antennas 55 (illustrated as 55A-55N, collectively referred to as an antenna 55) may be communicatively coupled directly or indirectly (e.g., through or via another component, a communication bus, a network) to one another to transmit and/or receive signals between one another.

The electronic device 10 may include the transmitter 52 and/or the receiver 54 that respectively enable transmission and reception of signals between the electronic device 10 and an external device via, for example, a network (e.g., including base stations or access points) or a direct connection. As illustrated, the transmitter 52 and the receiver 54 may be combined into the transceiver 30. The electronic device 10 may also have one or more antennas 55A-55N electrically coupled to the transceiver 30. The antennas 55A-55N may be configured in an omnidirectional or directional configuration, in a single-beam, dual-beam, or multi-beam arrangement, and so on. Each antenna 55 may be associated with one or more beams and various configurations. In some embodiments, multiple antennas of the antennas 55A-55N of an antenna group or module may be communicatively coupled to a respective transceiver 30 and each emit radio frequency signals that may constructively and/or destructively combine to form a beam. The electronic device 10 may include multiple transmitters, multiple receivers, multiple transceivers, and/or multiple antennas as suitable for various communication standards. In some embodiments, the transmitter 52 and the receiver 54 may transmit and receive information via other wired or wireline systems or means.

As illustrated, the various components of the electronic device 10 may be coupled together by a bus system 56. The bus system 56 may include a data bus, for example, as well as a power bus, a control signal bus, and a status signal bus, in addition to the data bus. The components of the electronic device 10 may be coupled together or accept or provide inputs to each other using some other mechanism.

Figures 3, 4:
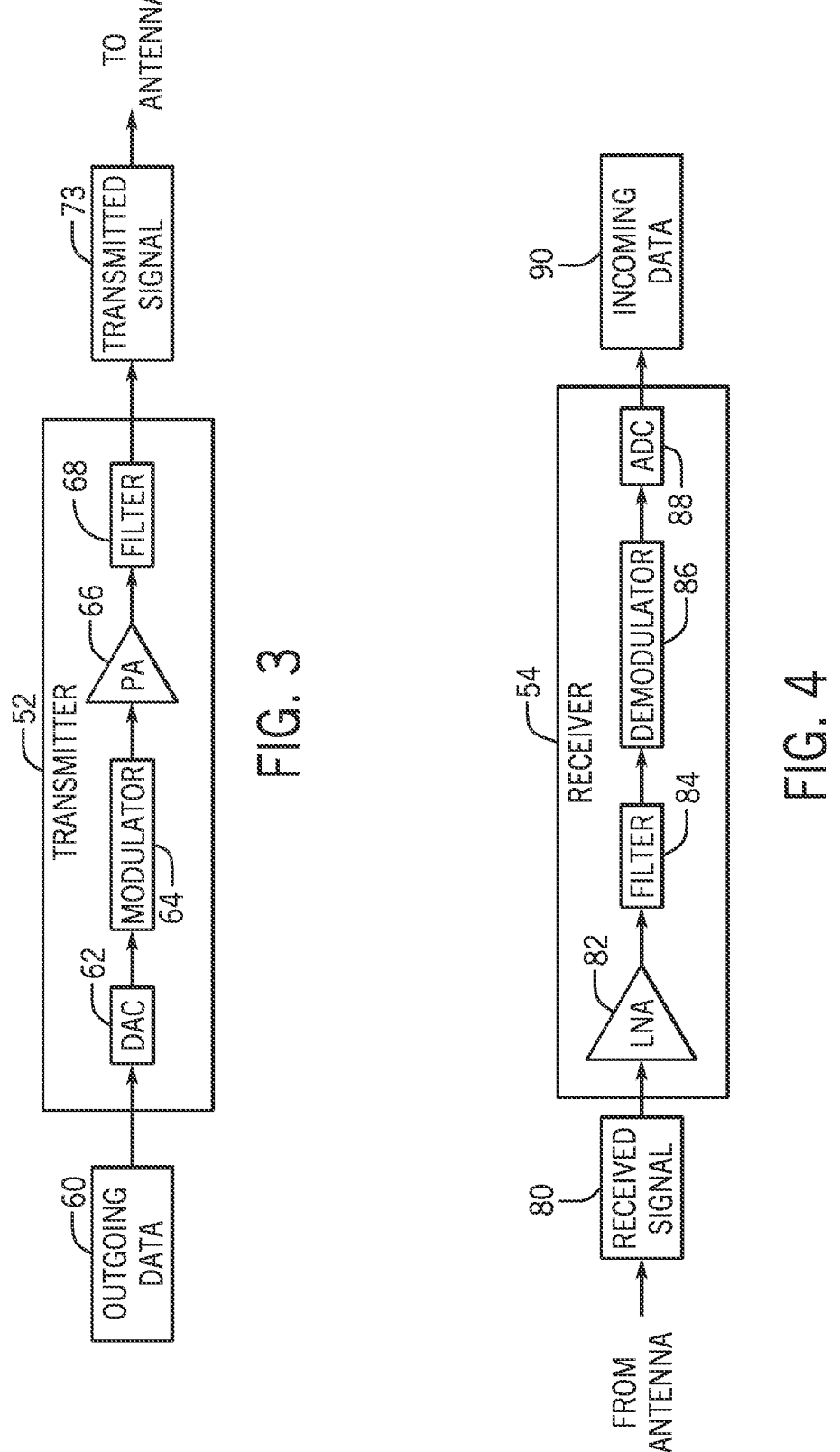
FIG. 3 is a schematic diagram of a transmitter of the electronic device of FIG. 1, according to embodiments of the present disclosure.
FIG. 4 is a schematic diagram of a receiver of the electronic device of FIG. 1, according to embodiments of the present disclosure.

FIG. 3 is a schematic diagram of the transmitter 52 (e.g., transmit circuitry), according to embodiments of the present disclosure. As illustrated, the transmitter 52 may receive outgoing data 60 in the form of a digital signal to be transmitted via the one or more antennas 55. A digital-to-analog converter (DAC) 62 of the transmitter 52 may convert the digital signal to an analog signal, and a modulator 64 may combine the converted analog signal with a carrier signal to generate a radio wave. A power amplifier (PA) 66 receives the modulated signal from the modulator 64. The power amplifier 66 may amplify the modulated signal to a suitable level to drive transmission of the signal via the one or more antennas 55. A filter 68 (e.g., filter circuitry and/or software) of the transmitter 52 may then remove undesirable noise from the amplified signal to generate transmitted signal 73 to be transmitted via the one or more antennas 55. The filter 68 may include any suitable filter or filters to remove the undesirable noise from the amplified signal, such as a bandpass filter, a bandstop filter, a low pass filter, a high pass filter, and/or a decimation filter.

The power amplifier 66 and/or the filter 68 may be referred to as part of a radio frequency front end (RFFE), and more specifically, a transmit front end (TXFE) of the electronic device 10. Additionally, the transmitter 52 may include any suitable additional components not shown, or may not include certain of the illustrated components, such that the transmitter 52 may transmit the outgoing data 60 via the one or more antennas 55. For example, the transmitter 52 may include a mixer and/or a digital up converter. As another example, the transmitter 52 may not include the filter 68 if the power amplifier 66 outputs the amplified signal in or approximately in a desired frequency range (such that filtering of the amplified signal may be unnecessary).

FIG. 4 is a schematic diagram of the receiver 54 (e.g., receive circuitry), according to embodiments of the present disclosure. As illustrated, the receiver 54 may receive received signal 80 from the one or more antennas 55 in the form of an analog signal. A low noise amplifier (LNA) 82 may amplify the received analog signal to a suitable level for the receiver 54 to process. A filter 84 (e.g., filter circuitry and/or software) may remove undesired noise from the received signal, such as cross-channel interference. The filter 84 may also remove additional signals received by the one or more antennas 55 that are at frequencies other than the desired signal. The filter 84 may include any suitable filter or filters to remove the undesired noise or signals from the received signal, such as a bandpass filter, a bandstop filter, a low pass filter, a high pass filter, and/or a decimation filter. The low noise amplifier 82 and/or the filter 84 may be referred to as part of the RFFE, and more specifically, a receiver front end (RXFE) of the electronic device 10.

A demodulator 86 may remove a radio frequency envelope and/or extract a demodulated signal from the filtered signal for processing. An analog-to-digital converter (ADC) 88 may receive the demodulated analog signal and convert the signal to a digital signal of incoming data 90 to be further processed by the electronic device 10. Additionally, the receiver 54 may include any suitable additional components not shown, or may not include certain of the illustrated components, such that the receiver 54 may receive the received signal 80 via the one or more antennas 55. For example, the receiver 54 may include a mixer and/or a digital down converter.

Figure 5:
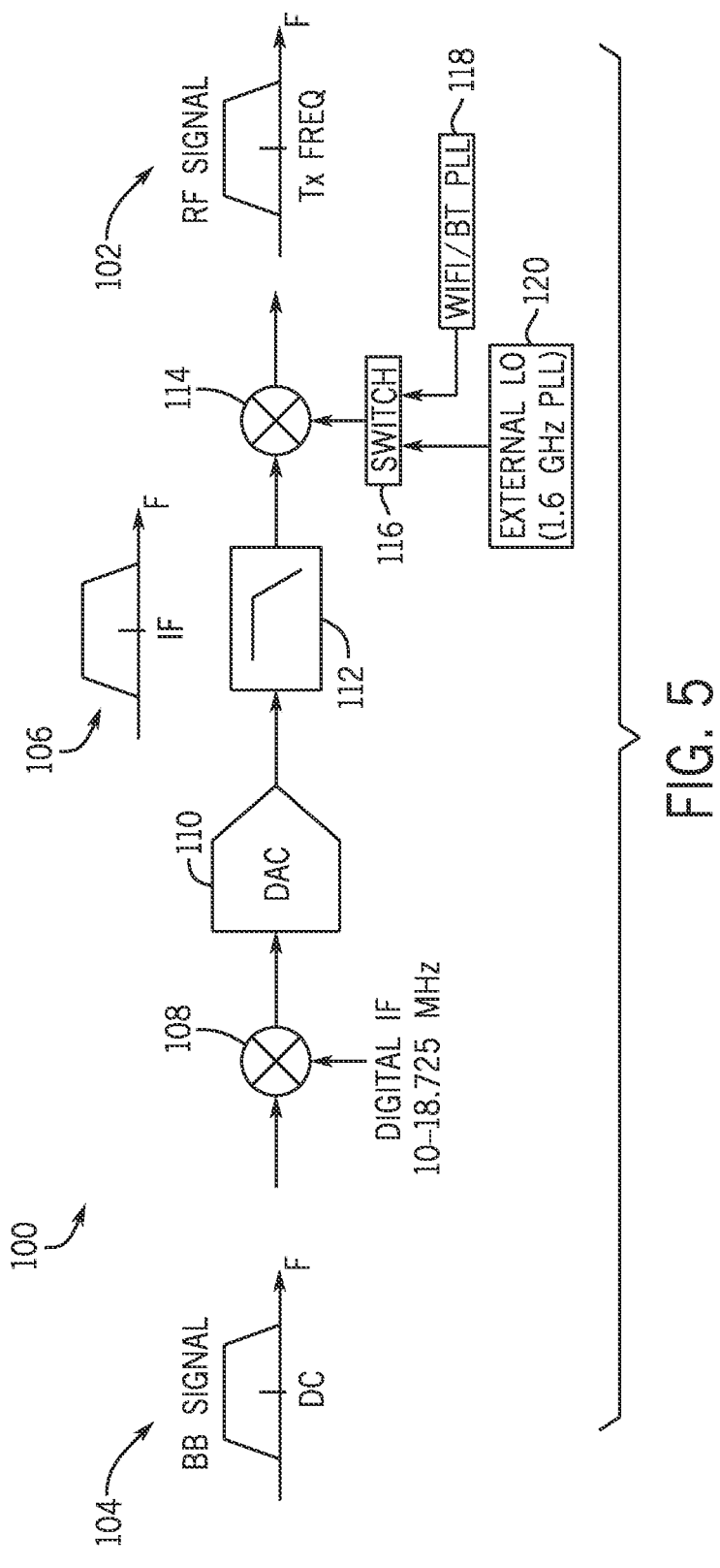
FIG. 5 is a schematic diagram of wireless transmitter circuitry that may be included in the network interface of FIG. 1, transceiver of FIG. 1, or transmitter of FIG. 2, according to embodiments of the present disclosure.

As noted above, the present disclosure describes techniques that may be utilized to communicate wirelessly using several different frequency ranges (e.g., frequency bands) that may be associated with different forms of wireless communication. In particular, as described below, an electronic device (e.g., electronic device 10) may include wireless communication circuitry that enables the electronic device to transmit wireless signals in a PAN (e.g., a BLUETOOTH® network), a LAN or WLAN (e.g., a network employing one of the IEEE 802.11x family of protocols, such as WI-FI®), and/or a WAN, which may be a satellite network or a non-terrestrial network. Bearing this in mind, FIG. 5 is a block diagram of wireless transmitter circuitry 100 that may be included in the electronic device 10 (e.g., in the network interface 26, transceiver 30, and/or transmitter 52) and generate a radio frequency (RF) signal 102 from a (BB) baseband signal 104 (which may be received or generated by the wireless transmitter circuitry 100). In this particular example, the RF signal 102 may have a frequency suitable for transmission over a WLAN (e.g., WI-FI®) or a WAN (e.g. a non-terrestrial network or a satellite network). For example, the RF signal 102 may have a frequency in a range of 2.400 GHz to 2.4835 GHz, inclusive, for PAN or WLAN communication, while the RF signal 102 may have a frequency of 1.610 GHz to 1.1618725 GHz, inclusive, for non-terrestrial network or satellite network communication. Thus, the wireless transmitter circuitry 100 may be utilized by the electronic device 10 to transmit wireless signals (e.g., the RF signal 102) over several different types of networks that may utilize different frequencies for transmitted signals. As described below, the RF signal 102 may be generated by converting the BB signal 104 into an intermediate frequency (IF) signal 106 that may be converted from digital to analog and modified to generate the RF signal 102.

In particular, a mixer 108 of the wireless transmitter circuitry 100 may receive the BB signal 104 and another signal, which may be generated by intermediate frequency circuitry (e.g., that may include one or more oscillators or a phase-locked loop (PLL)). The mixer 108 may output the IF signal 106, which may be a digital signal. The wireless transmitter circuitry 100 may also include DAC 110 (which may be the DAC 62), which may receive the IF signal 106 and convert the IF signal 106 from digital to analog. A filter 112 of the wireless transmitter circuitry 100, which may be the filter 68, may filter the resulting analog signal to remove undesirable noise from the analog signal, resulting in a filtered signal.

The wireless transmitter circuitry 100 may also include a mixer 114, a switch 116, a PLL 118, and an oscillator 120 (which may be included in a different PLL) that may be used to convert the filtered signal into the RF signal 102. In particular, the mixer 114 may receive the filtered signal from the filter 112 as well as a signal from the switch 116. The signal from the switch 116 may be a signal generated by the PLL 118 or the oscillator 120 that the switch 116 may select based on a type of wireless communication to be performed. For example, for one type of wireless communication (e.g., PAN or WLAN-based wireless communication), the switch 116 may have (or be switched to) a first position (e.g., a first state) to enable the signal from the PLL 118 that has a particular frequency (e.g., a frequency within a first range of frequencies) to pass through to the mixer 114, which may output the RF signal 102 for a PAN or WLAN. Thus, the switch 116 may select (or be caused by the processor 12 to select) a first position to communicatively couple the PLL 118 (or an oscillator thereof) to the mixer 114. For another type of wireless communication (e.g., with a satellite or non-terrestrial network-based communication), the switch 116 may have (or be switched to) a second position to enable a signal from the oscillator 120 having another frequency (e.g., a frequency within a second range of frequencies) to pass through to the mixer 114, which may output the RF signal 102 for communication with a satellite or in a non-terrestrial network. Thus, the switch 116 may select (or be caused by the processor 12) to select a second position (e.g., a second state) to communicatively couple the oscillator 120 (or a PLL that includes the oscillator 120) to the mixer 114. The PLL 118 and a PLL that may include the oscillator 120 may each include an oscillator (e.g., a variable frequency oscillator (VFO)) and a phase detector (also known as a phase comparator). In some embodiments, either or both of the PLL 118 and the oscillator 120 may be implemented using or include a local oscillator (LO).

As such, the mixer 114 may output the RF signal 102 with a frequency suitable for a particular type of network or wireless communication. It should be noted that, in some embodiments, the RF signal 102 may be amplified (e.g., by power amplifier circuitry) after being output from the mixer 114 to have a desired amplitude prior to being transmitted (e.g., by one or more of the antennas 55).

Figure 6:
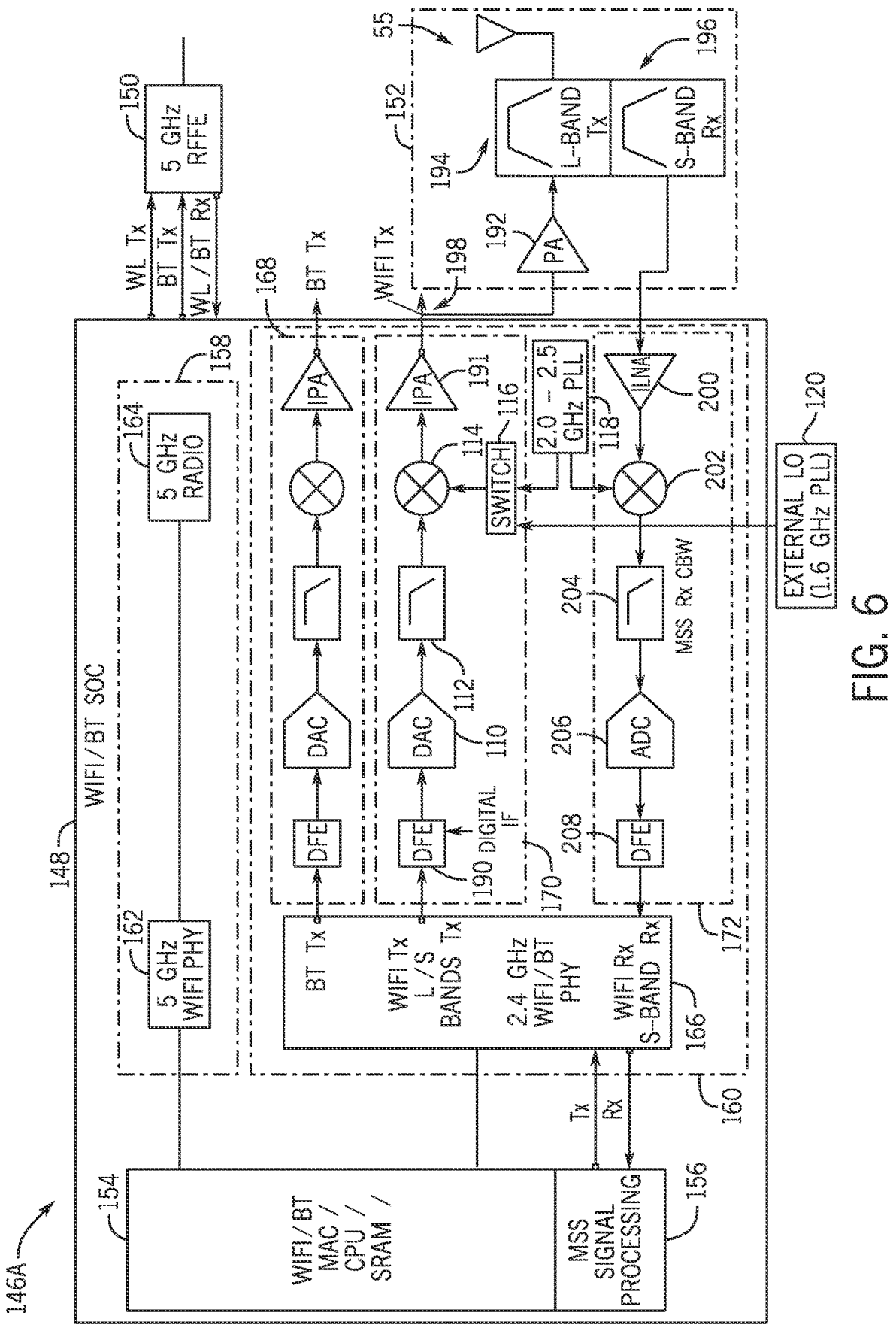
FIG. 6 is a block diagram of wireless communication circuitry that includes an integrated circuit (IC, e.g., a system-on-chip (SOC)) that may include the wireless transmitter circuitry of FIG. 5 and be included in the electronic device of FIG. 1, according to embodiments of the present disclosure.

FIG. 6 is a block diagram of wireless communication circuitry 146A that may be included in the electronic device 10. In particular, the wireless communication circuitry 146A may be partially included in the network interface 26, transceiver 30, transmitter 52, and/or receiver 54. As illustrated, the wireless communication circuitry 146A includes a system-on-chip (SOC) 148, a first radio frequency front end (RFFE) 150, a second RFFE 152, and the oscillator 120. As explained below, the wireless communication circuitry 146A may enable transmission and reception of RF signals over various frequency ranges. However, before continuing it should be noted that the components of the SOC 148 may be implemented separately in other embodiments. In other words, in other embodiments, the components of the SOC 148 described below may not be included in a system-on-chip but may otherwise be included in the electronic device 10.

As illustrated, the SOC 148 includes control circuitry 154, mobile satellite services (MSS) signal processing circuitry 156, first RF circuitry 158, and second RF circuitry 160. The control circuitry 154, which may be at least partially implemented by the processor 12 and/or the memory 14, may include processing circuitry (e.g., one or more processors), memory (e.g., RAM), and/or media access control (MAC) circuitry. The control circuitry 154 may cause signals to be generated for transmission (e.g., via the first RFFE 150 or the second RFFE 152) as well as process received signals (e.g., signals received via the first RFFE 150 or the second RFFE 152). In particular, the control circuitry 154 may control communication or communication processing for particular types of wireless communication, such as PAN and WLAN-based communication. The control circuitry 154 may also process received signals.

The MSS signal processing circuitry 156, which may be included in the control circuitry 154, may control the generation of signals to be transmitted by the electronic device 10 to a device in a satellite network or non-terrestrial network, such as a satellite. The MSS signal processing circuitry 156 may also process received signals (e.g., signals transmitted from a satellite to the electronic device 10).

The first RF circuitry 158 may be utilized for transmitting and receiving signals having a first frequency range, such as frequencies in the 5 GHz band. Accordingly, the first RF circuitry 158 may be utilized for 5 GHz wireless communication, such as WI-FI® communication or BLUETOOTH® communication. In particular, the first RF circuitry 158 may include physical layer circuitry 162 and radio circuitry 164 that may be communicatively coupled to the control circuitry 154 and the first RFFE 150. The physical layer circuitry 162 may generate baseband signals (e.g., based on control signals from the control circuitry 154) as well as send received signals to the control circuitry 154. The radio circuitry 164 may include a DAC, an ADC, a modulator, one or more amplifiers, one or more filters, and the radio circuitry 164 may be utilized to generate analog signals having a desired frequency (e.g., in the 5 GHz band of frequencies) from the baseband signals and to generate digital signals from signals received via the first RFFE 150. The first RFFE 150 may include one or more amplifiers, filters, and antennas. The first RFFE 150 may transmit signals generated by the radio circuitry 164 as well as receive wireless signals (e.g., 5 GHz wireless signals). Accordingly, first RF circuitry 158 may be utilized for transmitting and receiving signals having a first frequency range, such as signals utilized for 5 GHz wireless communication.

The second RF circuitry 160 may be utilized for transmitting and receiving signals having other frequency ranges, such as the IEEE L band (e.g., frequencies from one GHz to two GHz) and the IEEE S band (e.g., frequencies from two GHz to four GHz), the latter of which includes the 2.4 GHz frequency band that may be utilized for PAN (e.g., BLUETOOTH®) and WLAN (e.g., WI-FI®) communication. The second RF circuitry 160 may include physical layer circuitry 166, first RF transmitter circuitry 168, second transmitter circuitry 170, receiver circuitry 172, and the PLL 118. The physical layer circuitry 166 may receive signals from the control circuitry 154 and the MSS signal processing circuitry 156 and generate baseband signals (or cause the baseband signals to be generated) based on the received signals. The physical layer circuitry 166 may also send received signals (e.g., received via the receiver circuitry 172) to the control circuitry 154 and the MSS signal processing circuitry 156.

The first transmitter circuitry 168 may be utilized to generate RF signals in the 2.4 GHz frequency band (e.g., 2.400 GHz to 2.4835 GHz) to be communicated via a BLUETOOTH® network, and the first transmitter circuitry 168 may include a digital front-end (DFE) that generates baseband signals, a DAC, one or more filters, one or more mixers, and one or more power amplifiers (e.g., internal power amplifiers (iPAs)). It should be noted that the wireless communication circuitry 146A may also include another RFFE communicatively coupled to the first transmitter circuitry 168 that may be utilized to transmit and receive BLUETOOTH® signals. In other embodiments, the wireless communication circuitry 146A may not include the first transmitter circuitry 168 or may utilize a single transmission pathway (e.g., second transmitter circuitry 170) that is utilized for BLUETOOTH® (or other PAN) and WI-FI® (or other WLAN) communication.

The second transmitter circuitry 170 may be utilized to generate RF signals (e.g., the RF signal 102) that may have a frequency in the S band or the L band. Thus, the second transmitter circuitry 170 may generate signals with S band frequencies utilized for PAN or WLAN communication as well as signals with L band frequencies utilized for satellite network or non-terrestrial network communication (e.g., signals with a frequency of 1.610 GHz to 1.1618725 GHz). The second transmitter circuitry 170 may include a digital front end 190, which may receive or generate a baseband signal. The digital front end 190 may also include the mixer 108 of FIG. 5 as well as an oscillator or PLL that generates a signal that is sent to the mixer 108 to generate the IF signal 106 (which may also be considered a modified baseband signal). The frequency of the signal from the oscillator or PLL of the digital front end 190 may be controlled based on the type of communication to be performed (e.g., based on an indication from the processor 12, control circuitry 154, or MSS signal processing circuitry 156 indicating a frequency (or range of frequencies) of a signal to be transmitted or a type of communication associated with the signal to be transmitted). In one embodiment, the signal generating by the oscillator may have a frequency of 10 megahertz (MHz) to 18.725 MHz, inclusive. Thus, the digital front end 190 may adaptively modify baseband signals based on the target frequency of the RF signal to be transmitted. As discussed above, the DAC 110 may convert the received signal (e.g., from the digital front end 190) to analog, and the filter 112 may filter out particular frequencies from the analog signal.

As also discussed above, the switch 116 may receive a signal from the PLL 118, receive another signal from the oscillator 120, and selectively output one of the two received signals. In particular, the control circuitry 154 and/or MSS signal processing circuitry 156 may control the output of the switch 116 based on the type of communication to be utilized (or a frequency or frequency range associated with the type of communication). In other words, the switch 116 may be controlled based on an indication of the type of wireless communication to be utilized. The PLL 118 may output a signal such that, when mixed with the output of the filter 112 by the mixer 114, the resulting signal (e.g., the RF signal 102) has an S band frequency or, more specifically, a 2.4 GHz frequency (e.g., 2.400 GHz to 2.4835 GHz) that may be utilized for PAN or WLAN communication (e.g., WI-FI®). The oscillator 120 may output another signal such that, when mixed with the output of the filter 112 by the mixer 114, the resulting signal (e.g., the RF signal 102) has an L band frequency that may be utilized for communication between the electronic device 10 and a satellite (e.g., in a non-terrestrial network), such as a frequency of 1.610 GHz to 1.1618725 GHz. The second transmitter circuitry 170 may also include a power amplifier 191, which may be an internal power amplifier, that may amplify RF signals output by the mixer 114. As such, second transmitter circuitry 170 (and, more specifically, the mixer 114) may output RF signals (e.g., RF signal 102) having a frequency suitable for PAN and WLAN communication as well as non-terrestrial network and satellite network communication. Thus, the same signal pathway (e.g., the second transmitter circuitry 170) may be utilized to generate RF signals in different frequency bands that are utilized for different types of wireless communication.

The second RFFE 152 may include a power amplifier 192, a filter 194, and filter 196, and the one or more antennas 55. The power amplifier 192 may amplify RF signals received from the second transmitter circuitry 170 (e.g., as output by the power amplifier 191 via an output 198 of the SOC 148) to generate amplified RF signals, which may be filtered by the filter 194 or filter 196 prior to being transmitted by the antenna(s) 55. For example, the filter 194 may be utilized on RF signals having L band frequencies to filter out non-L band frequencies (or frequencies outside of 1.610 GHz to 1.1618725 GHz), while the filter 196 may be utilized on RF signals having S band frequencies to filter out non-S band frequencies (or frequencies outside of 2.400 GHz to 2.4835 GHz). The filter 194, the filter 196, or both the filter 194 and the filter 196 may be the filter 68 or included in the filter 68. The antenna(s) 55 may transmit signals output by the filter 194 and filter 196. The second RFFE 152 may also receive signals, for instance, from other electronic devices or from a satellite. The filter 196 may filter received signals (e.g., received S band signals) and send the filtered signals to the receiver circuitry 172.

The receiver circuitry 172 may include an amplifier 200 (e.g., an internal low noise amplifier (iLNA) that may be the LNA 82) that may amplify the received analog signal to a suitable level for processing. The receiver circuitry 172 may also include a mixer 202 that may mix the output of the amplifier 200 with the signal generated by the PLL 118 (e.g., to generate an IF signal from the received RF signal). The output of the mixer 202 may be filtered by filter 204, which may be the filter 84, to remove undesired noise from the received signal, such as cross-channel interference. The output of the filter 204 may be converted from analog to digital by an ADC 206 of the receiver circuitry 172, which may be the ADC 88. The receiver circuitry 172 may also include digital front end 208, which may send digital signals to the physical layer circuitry 166, which may send the digital signals for processing to the control circuitry 154 or the MSS signal processing circuitry 156.

Figure 7:
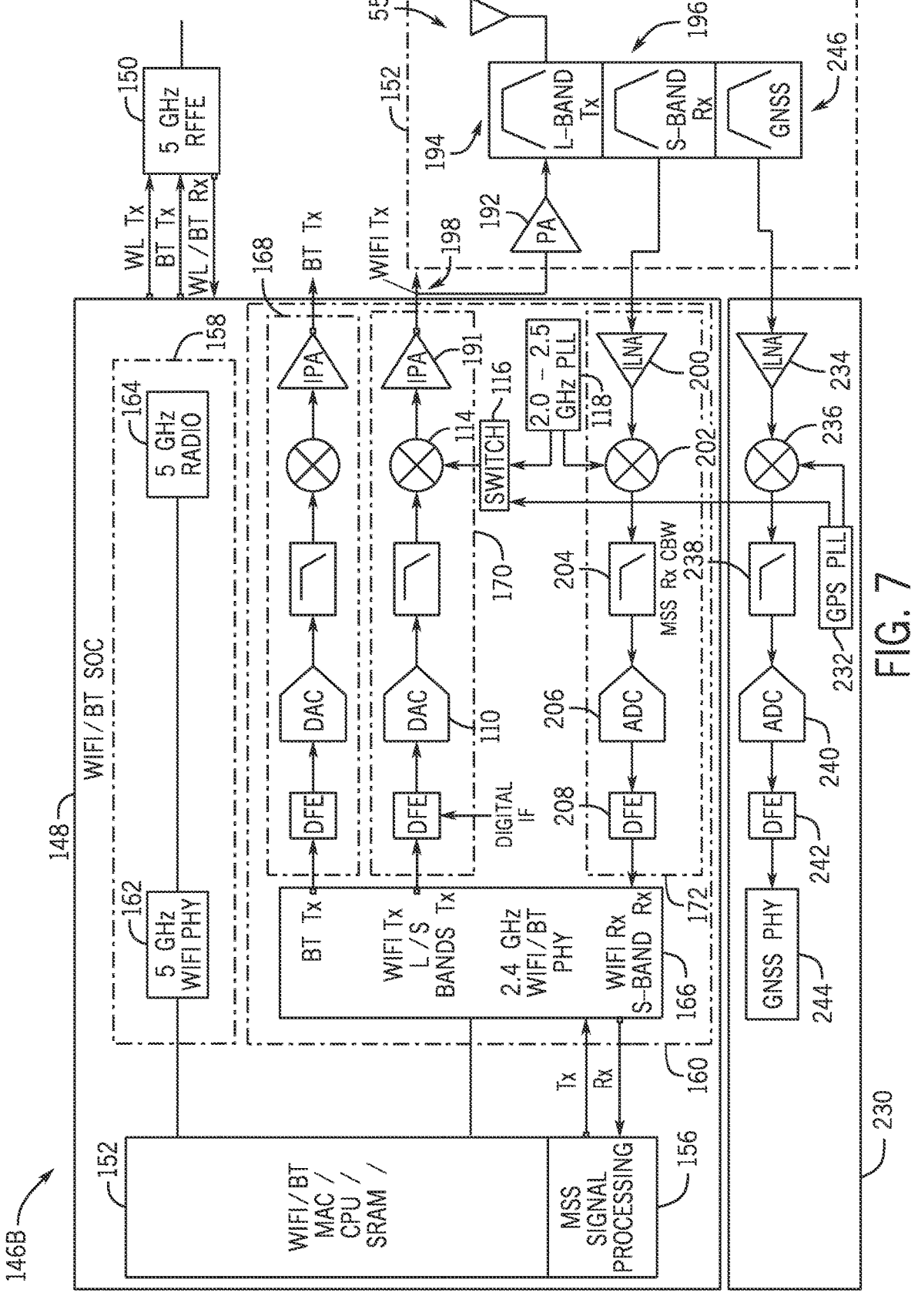
FIG. 7 is a block diagram of other wireless communication circuitry in which an oscillator of the SOC of FIG. 6 is included in, or replaced by, a phase-locked loop (PLL) included in yet another SOC, according to embodiments of the present disclosure.

FIG. 7 is a block diagram of wireless communication circuitry 146B that includes the SOC 148, the first RFFE 150, the second RFFE 152, and a second SOC 230. The SOC 148 and the first RFFE 150 may include the same components and operate in the same manner as described above with respect to FIG. 6 except that the switch 116 may receive a signal from a PLL 232 of the SOC 230 utilized for another type of wireless communication, such as global navigation satellite system (GNSS) communication, instead of the oscillator 120. Alternatively, the PLL 232 may include the oscillator 120. Thus, the signal from the PLL 232 may be utilized for satellite network and non-terrestrial network communication. Examples of GNSSs include Global Positioning System (GPS), Global Navigation Satellite System (GLONASS), BeiDou Navigation Satellite System, Galileo, Quasi-Zenith Satellite System (QZSS), and Indian Regional Navigation Satellite System (IRNSS). The PLL 232 may output signals having frequencies such that, when mixed (by the mixer 114) with signals output by the filter 112, the resulting RF signals have a suitable frequency (e.g., for WLAN, PAN, satellite network, or non-terrestrial network communication). GNSS communication may be associated with, or utilize, another frequency range or band, such as the GPS L1 band (e.g., 1559 MHz to 1610 MHz).

The SOC 230 may also include circuitry utilized to operate on received signals, such as an amplifier 234 (e.g., an iLNA), a mixer 236, a filter 238, an ADC 240, a digital front end 242, and physical layer circuitry 244, which may respectively operate generally similar to the amplifier 200, the mixer 202, the filter 204, the ADC 206, the digital front end 208, and the physical layer circuitry 166. Additionally, it should be noted that the physical layer circuitry 244 may be communicatively coupled to the control circuitry 154 and/or the processor 12, which may process the GNSS communication signals received by the antenna(s) 55. It should also be noted that, in the wireless communication circuitry 146B of FIG. 7, the second RFFE 152 may also include a filter 246 utilized for filtering GNSS communication signals. Thus, the filter 246 may filter signals received via the antenna(s) 55.

Figure 8:
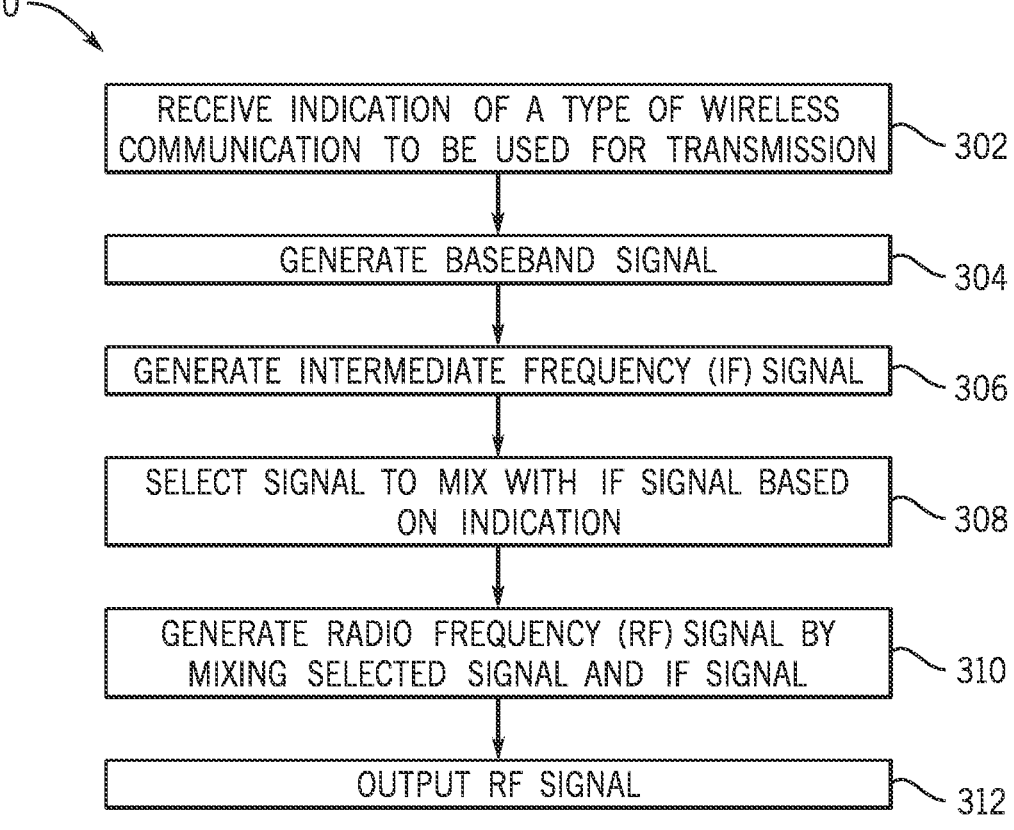
FIG. 8 is a flow diagram of a process for transmitting radio frequency signals using the wireless transmitter circuitry of FIG. 5 or the wireless communication circuitry of FIG. 6 or FIG. 7, according to embodiments of the present disclosure.

FIG. 8 is a flow diagram a process 300 for the electronic device 10 to transmit RF signals (e.g., using the wireless transmitter circuitry 100, wireless communication circuitry 146A, wireless communication circuitry 146B), according to embodiments of the present disclosure. Any suitable device (e.g., a controller) that may control components of the electronic device 10, such as the processor 12, the control circuitry 154, or the MSS signal processing circuitry 156, may perform the process 300. In some embodiments, the process 300 may be implemented by executing instructions stored in a tangible, non-transitory, computer-readable medium, such as the memory 14 or storage 16, using the processor 12, the control circuitry 154, or the MSS signal processing circuitry 156. For example, the process 300 may be performed at least in part by one or more software components, such as an operating system of the electronic device 10, one or more software applications of the electronic device 10, and the like. Thus, while the process 300 is largely described below as being performed by the control circuitry 154 utilizing the wireless communication circuitry 146A, it should be noted that the process 300 may be performed by the processor 12 or MSS signal processing circuitry 156 utilizing the wireless transmitter circuitry 100 or the wireless communication circuitry 146B. Additionally, while the process 300 is described using steps in a specific sequence, it should be understood that the present disclosure contemplates that the described steps may be performed in different sequences than the sequence illustrated, and certain described steps may be skipped or not performed altogether.

In process block 302, the control circuitry 154 may receive an indication of a type of wireless communication to be utilized to transmitting a wireless signal. For example, the indication may be indicative of a frequency range or band, a type of network, or a particular network. The type of network indicated may include, but is not limited to, a WLAN (e.g., WI-FI® network), a PAN (e.g., BLUETOOTH® network), a satellite network, or a non-terrestrial network. The indication may be received from the processor 12 or generated by the control circuitry 154 itself.

In process block 304, the control circuitry 154 may cause a baseband signal to be generated. For example, the control circuitry 154 may cause physical layer circuitry 166 or the second transmitter circuitry 170 to generate the baseband signal in response to receiving the indication. In process block 306, the mixer 108 or digital front end 190 (which may include the mixer 108), may generate an IF signal (e.g., an IF digital signal). As described above, the mixer 108 (and digital front end) may mix the baseband signal with another signal (e.g., generated by an oscillator or PLL) to generate the IF signal.

In process block 308, the control circuitry 154 may select a signal to mix with the IF signal based on the indication received in process block 302. For instance, in the context of the wireless transmitter circuitry 100 and the wireless communication circuitry 146A, the control circuitry 154 may select a signal output by the PLL 118 or a signal output by the oscillator 120. In the context of the wireless communication circuitry 146B, the control circuitry 154 may select a signal output by the PLL 118 or a signal output by the PLL 232 (which may include the oscillator 120). More specifically, the control circuitry 154 may select the signal from the PLL 118 when the indication is indicative of PAN or WLAN communication, and the control circuitry 154 may select the signal from the oscillator 120 or PLL 232 when the indication is indicative of non-terrestrial network or satellite network communication. The control circuitry 154 may cause the switch to selectively enable either the signal from the PLL 118 or oscillator 120 (or the PLL 232) to pass through the switch 116 to the mixer 114. In other words, the switch 116 may select (or be caused to select by the control circuitry 154 or the processor 12) a switch position (or state) to communicatively couple the mixer 114 to the PLL 118 or to the oscillator 120 (in the context of the wireless transmitter circuitry 100 and the wireless communication circuitry 146A) or to communicatively couple the mixer 114 to either the PLL 118 or the PLL 232 (in the context of the wireless communication circuitry 146B).

In process block 310, the mixer 114 may generate a radio frequency signal (e.g., RF signal 102) by mixing the IF signal and the signal selected at process block 308. In process block 312, the mixer 114 may output the RF signal. As noted above, the SOC 148 may also output the RF signal 102 to the second RFFE 152 for transmission by the antenna (s). As discussed above, the RF signal 102 may be amplified (e.g., by either or both of the power amplifier 191 and the power amplifier 192) prior to being transmitted by the antenna(s) 55. In this manner, the process 300 enables the electronic device to generate RF signals in multiple frequency bands using a single transmission pathway (e.g., the second transmitter circuitry 170) to be used for multiple types of wireless communication.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ," it is intended that such elements are to be interpreted under 35 U.S.C. 112(f). However, for any claims containing elements designated in any other manner, it is intended that such elements are not to be interpreted under 35 U.S.C. 112(f).

It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

The invention claimed is:

1. Wireless communication circuitry, comprising:
   a first mixer configured to generate an intermediate frequency (IF) digital signal;
   a digital-to-analog converter (DAC) communicatively coupled to the first mixer and configured to convert the IF digital signal to an analog signal;
   a first phase-locked loop (PLL);
   an oscillator;
   a switch communicatively coupled to the first PLL and the oscillator, the switch configured to:
      receive a first signal from the first PLL and a second signal from the oscillator; and
      output a third signal by selectively outputting either the first signal or the second signal; and a second mixer communicatively coupled to the first mixer and the switch.

2. The wireless communication circuitry of claim 1, wherein the second mixer is configured to generate a radio frequency (RF) signal based on the third signal and the analog signal.

3. The wireless communication circuitry of claim 2, wherein the RF signal has a first frequency associated with a first wireless network when the switch outputs the first signal, and the RF signal has a second frequency associated with a second wireless network when the switch outputs the second signal.

4. The wireless communication circuitry of claim 3, wherein the first wireless network comprises a wireless local area network (WLAN) or a personal area network (PAN), and the second wireless network comprises a non-terrestrial network or a satellite network.

5. The wireless communication circuitry of claim 3, wherein the first frequency is between 2.4 gigahertz (GHz) and 2.4835 GHz, and the second frequency is between 1.61 GHz to 1.1618725 GHz.

6. The wireless communication circuitry of claim 3, comprising a second PLL communicatively coupled to the first mixer and configured to output a fourth signal to the first mixer, wherein the first mixer is configured to generate the IF digital signal based on the fourth signal and a baseband signal, the second PLL is included on a system-on-chip (SOC), and the first PLL is located external to the SOC.

7. The wireless communication circuitry of claim 6, wherein the first PLL is included in a second SOC utilized for communicating using a third wireless network.

8. The wireless communication circuitry of claim 2, comprising:

a second PLL communicatively coupled to the first mixer and configured to output a fourth signal to the first mixer, wherein the first mixer is configured to generate the IF digital signal based on the fourth signal and a baseband signal;

a filter communicatively coupled to the DAC and the second mixer, wherein the filter is configured to filter one or more frequencies of the analog signal; and one or more amplifiers communicatively coupled to the second mixer and configured to amplify the RF signal.

9. The wireless communication circuitry of claim 1, comprising a second PLL communicatively coupled to the first mixer and configured to output a fourth signal to the first mixer, wherein the first mixer is configured to generate the IF digital signal based on the fourth signal and a baseband signal.

10. An electronic device, comprising:

wireless communication circuitry comprising a first mixer configured to generate an intermediate frequency (IF) digital signal based at least in part on a baseband signal, a digital-to-analog converter (DAC) communicatively coupled to the first mixer, a first oscillator configured to generate a first signal, a second oscillator configured to generate a second signal, a second mixer communicatively coupled to the DAC and configured to output a radio frequency (RF) signal to be transmitted in a wireless network, and a switch configured to couple the second mixer to the first oscillator in a first state, and couple the second mixer to the second oscillator in a second state; and processing circuitry configured to cause the switch to select the first state or the second state.

11. The electronic device of claim 10, wherein when the wireless network comprises a wireless local area network (WLAN), the processing circuitry is configured to cause the switch to select the first state, and when the wireless network comprises a non-terrestrial network, the processing circuitry is configured to cause the switch to select the second state.

12. The electronic device of claim 11, comprising a system-on-chip (SOC), wherein the SOC comprises the DAC, the first oscillator, and the second mixer, and the second oscillator is located external to the SOC.

13. The electronic device of claim 12, wherein the wireless communication circuitry comprises a first phase-locked loop (PLL) that comprises the first oscillator and a second PLL that comprises the second oscillator.

14. The electronic device of claim 13, wherein the second PLL is configured to be utilized when performing global navigation satellite systems (GNSS) wireless communication.

15. The electronic device of claim 12, comprising a plurality of amplifiers communicatively coupled to the second mixer and configured to receive the RF signal and amplify the RF signal to output an amplified RF signal, wherein the plurality of amplifiers comprises a first amplifier included in the SOC and a second amplifier included in a radio frequency front end (RFFE) of the electronic device, and one or more antennas configured to transmit the amplified RF signal.

16. The electronic device of claim 10, wherein the second mixer is configured to output the RF signal to be transmitted in the wireless network, when the wireless network comprises a personal area network (PAN), the processing circuitry is configured to cause the switch to select the first state, and when the wireless network comprises a non-terrestrial network, the processing circuitry is configured to cause the switch to select the second state.

17. A method, comprising:

generating, via wireless communication circuitry, a baseband signal;

generating, via the wireless communication circuitry, an intermediate frequency (IF) digital signal based at least in part on the baseband signal;

selecting, via a switch of the wireless communication circuitry, a first state of the switch or a second state of the switch, wherein when in the first state, the switch is communicatively coupled to a phase-locked loop (PLL) and configured to receive a first signal having a first frequency from the PLL, and when in the second state, the switch is communicatively coupled to an oscillator and configured to receive, from the oscillator, a second signal having a second frequency different from the first frequency, outputting, via the switch, the first signal as a third signal or the second signal as the third signal; and outputting, via the wireless communication circuitry, a radio frequency (RF) signal based on the IF digital signal and the third signal.

18. The method of claim 17, comprising receiving, via processing circuitry, an indication of a type of wireless communication to be used by the wireless communication circuitry for transmission, and selecting, based on the indication of the type of wireless communication, the first state of the switch or the second state of the switch.

19. The method of claim 18, wherein the type of wireless communication comprises communication between a satellite and an electronic device that comprises the processing circuitry and the wireless communication circuitry.

20. The method of claim 17, comprising converting, via a digital-to-analog converter (DAC) of the wireless communication circuitry, the IF digital signal into an analog signal, and generating a filtered signal by filtering, via a filter of the wireless communication circuitry, the analog signal, wherein outputting the RF signal comprises mixing, via a mixer of the wireless communication circuitry, the filtered signal and the third signal, and the method further comprises generating an amplified RF signal by amplifying, via one or more amplifiers, the RF signal, and transmitting the amplified RF signal via one or more antennas.

* * * * *